United States Patent
Kamphuis et al.

(10) Patent No.: US 12,199,333 B2
(45) Date of Patent: Jan. 14, 2025

(54) SEMICONDUCTOR DEVICE HAVING UNIFORM MULTI-PACKAGE ANTENNA ARRAY AND METHOD OF MANUFACTURE

(71) Applicant: NXP B.V., San Jose, CA (US)

(72) Inventors: Antonius Hendrikus Jozef Kamphuis, Nijmegen (NL); Jan Willem Bergman, Veghel (NL); Marcellinus Johannes Maria Geurts, Beuningen (NL); Mustafa Acar, Eindhoven (NL); Paul Mattheijssen, Boxtel (NL); Rajesh Mandamparambil, Eindhoven (NL); Andrei-Alexandru Damian, Arnhem (NL); Amar Ashok Mavinkurve, Malden (NL)

(73) Assignee: NXP B.V., Eindhoven (NL)

( * ) Notice: Subject to any disclaimer, the term of this patent is extended or adjusted under 35 U.S.C. 154(b) by 389 days.

(21) Appl. No.: 17/649,725

(22) Filed: Feb. 2, 2022

(65) Prior Publication Data

US 2022/0263222 A1    Aug. 18, 2022

(30) Foreign Application Priority Data

Feb. 15, 2021  (EP) .................................. 21157067

(51) Int. Cl.
*H01Q 1/22* (2006.01)
*H01L 23/60* (2006.01)
(Continued)

(52) U.S. Cl.
CPC .......... *H01Q 1/2283* (2013.01); *H01L 23/60* (2013.01); *H01L 25/0655* (2013.01); *H01L 25/50* (2013.01); *H01Q 9/0407* (2013.01)

(58) Field of Classification Search
CPC ...... H01Q 1/2283; H01Q 21/00; H01Q 1/523; H01Q 9/0407; H01Q 21/0087; H01L 25/0655
See application file for complete search history.

(56) References Cited

U.S. PATENT DOCUMENTS

| 4,990,462 A | 2/1991 | Sliwa, Jr. |
| 5,909,052 A | 6/1999 | Ohta et al. |

(Continued)

FOREIGN PATENT DOCUMENTS

| EP | 3315994 A1 | 5/2018 |
| JP | H11145374 A | 5/1999 |

OTHER PUBLICATIONS

Gu, X., "A Compact 4-Chip Package with 64 Embedded Dual-Polarization Antennas for W-band Phased-Array Transceivers", 20TC14 IEEE 64th Electronic Components and Technology Conference (ECTC), May 27-30, 2014.
(Continued)

*Primary Examiner* — Khiem D Nguyen (57) ABSTRACT

A semiconductor device comprising a substrate, a first integrated circuit package mounted on the substrate, the first integrated circuit package comprising a first antenna sub-array having a uniform pitch, and a second integrated circuit package mounted on the substrate, the second integrated circuit package comprising a second antenna sub-array having a uniform pitch. The second integrated circuit package is mounted adjacent to the first integrated circuit package to form a multi-package module having an antenna array formed of the first antenna sub-array and the second antenna sub-array, wherein the antenna array has a uniform pitch. Also provided is a method of manufacturing a multi-package module and a method of providing package-to-package grounding.

14 Claims, 7 Drawing Sheets

(51) Int. Cl.
    *H01L 25/00*     (2006.01)
    *H01L 25/065*     (2023.01)
    *H01Q 9/04*     (2006.01)

(56) References Cited

U.S. PATENT DOCUMENTS

| | | |
|---|---|---|
| 7,045,887 B2 | 5/2006 | Karnezos |
| 9,633,976 B1 | 4/2017 | Bernstein et al. |
| 10,320,051 B2* | 6/2019 | Chiu .................. H05K 7/20336 |
| 10,620,305 B2 | 4/2020 | Cornic et al. |
| 10,930,620 B2* | 2/2021 | Rieh ........................ G01S 13/89 |
| 11,777,221 B2* | 10/2023 | Ueda ........................ H01Q 5/42 |
| | | 343/702 |
| 2016/0268683 A1 | 9/2016 | Wang et al. |
| 2016/0310832 A1* | 10/2016 | Dandamudi .......... A63F 13/235 |
| 2017/0054221 A1* | 2/2017 | West ........................ H01Q 3/46 |
| 2019/0189606 A1* | 6/2019 | Kamphuis ............... H01L 25/50 |
| 2022/0231401 A1* | 7/2022 | Taveniku ............. H01Q 1/2291 |
| 2022/0311137 A1 | 9/2022 | Bergman et al. |

OTHER PUBLICATIONS

Saeidi-Manesh, H., "Challenges and Limitations of the Cross-Polarization Suppression in Dual-Polarization Antenna Arrays Using Identical Subarrays", IEEE Transactions on Antennas and Propagation, vol. 68, No. 4, Apr. 2020.

\* cited by examiner

//SEMICONDUCTOR DEVICE HAVING UNIFORM MULTI-PACKAGE ANTENNA ARRAY AND METHOD OF MANUFACTURE

CROSS-REFERENCE TO RELATED APPLICATIONS

This application claims the priority under 35 U.S.C. § 119 of European Patent application no. 21157067.6, filed on 15 Feb. 2021, the contents of which are incorporated by reference herein.

BACKGROUND

The present specification relates to multi-package modules formed of a first integrated circuit package and a second integrated circuit package, and methods of manufacture thereof.

Typically, in integrated circuit design flip chip (FC) bonding to laminate is used to reduce antenna array inaccuracies. Multiple semiconductor chips are FC-bonded to a laminate antenna array. For mmWave signals, and in particular for 6G applications, the tolerances of laminate are insufficient, so fan-out package technology is used to reduce tolerances. Fan-out packages are generally made in large formats and cut into single packages for yield reasons. For beam-forming of mmWave signals, the antenna array required can become too big for one package, so it is known to place two or more packages close together on a printed circuit board, each package comprising an antenna sub-array, to form a larger antenna array. This may be referred to as a multi-package module.

The two (or more) packages are usually surface mounted to a printed circuit board (PCB). The accuracy of package-to-package connections depends on the solder alignment. Any gaps, discontinuities, or irregularities between the antenna sub-arrays results in RF losses and reduced performance of the semiconductor device. For example, surface waves can create a pointing error that leads to non-optimal antenna performance. In order to have optimum antenna performance both array regularity as well as discontinuity between the sub-arrays (or packages) should ideally be minimised.

It is known to minimise the package dimensions in such way that by surface mounting the packages will automatically align in a grid, due to the high amount of solder ball per package.

Generally, no grounding is provided between the two packages. Instead, each package is separately grounded via the customer PCB.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising: a substrate, a first integrated circuit package mounted on the substrate, the first integrated circuit package comprising a first antenna sub-array having a uniform pitch, and a second integrated circuit package mounted on the substrate, the second integrated circuit package comprising a second antenna sub-array having a uniform pitch. The second integrated circuit package is mounted adjacent to the first integrated circuit package to form a multi-package module having an antenna array formed of the first antenna sub-array and the second antenna sub-array, wherein the antenna array has a uniform pitch that is the same as the pitch of the first antenna sub-array and the second antenna sub-array.

Optionally, the antenna array (formed of the first antenna sub-array and the second antenna sub-array) comprises a plurality of antenna elements and each of the antenna elements is the same size and shape.

The first and second integrated circuit packages may be referred to as antenna-in-package (AiP) packages.

The term 'package' may be used interchangeably with 'integrated circuit package' throughout this disclosure. The first and second integrated circuit packages may also be referred to as tiles which combine to form the multi-package module.

The first antenna sub-array and the second antenna sub-array may be patch antenna arrays. The antenna array may be referred to as an active phased array antenna.

The antenna array may be controlled integrally by a processor, or a CPU.

The first antenna sub-array and the second antenna sub-array may each comprise a grid of antenna elements separated by shielding walls. Thus, the antenna array of the multi-package module may comprise a grid of antenna elements separated by shielding walls. Each antenna element may comprise a patch antenna. Each antenna element may have the same size and shape. When mounted on the substrate, the spacing between each antenna element may be equal.

Throughout this disclosure 'antenna element' refers to the square of the antenna grid containing the patch antenna, not to the patch antenna itself.

Optionally, the spacing between the final column of antenna elements in the first antenna sub-array and the first (or adjacent) column of antenna elements in the second antenna sub-array may be the same as the spacing between adjacent antenna elements in the first and second antenna sub-arrays.

The first antenna sub-array may comprise a first N×M sub-array. The second antenna sub-array may comprise a second N×M sub-array. The number of rows or columns in the second antenna sub-array does not necessarily match the number of rows or columns in the first antenna sub-array.

In some embodiments, the first antenna sub-array and/or the second antenna sub-array may comprise an N×N antenna grid (e.g. a square antenna sub-array).

The first and second packages may be positioned such that the antenna array of the multi-package module comprises an N×2M antenna array, or a 2N×M array.

The present disclosure is not limited to the use of two packages. The multi-package module may comprise a plurality of integrated circuit packages (e.g. three or more packages). The packages may be arranged to form an (Y·N)×(X·M) array.

Optionally, a plurality of multi-package modules may be provided, wherein each multi-package module comprises at least two packages. The multi-package modules may be positioned adjacent to each other on the substrate.

The substrate may be a printed circuit board (PCB).

The first integrated circuit package and the second integrated circuit package may be surface-mounted to the substrate by a plurality of solder bumps.

Optionally, there is a gap between the first integrated circuit package and the second integrated circuit package when mounted on the substrate. Thus, the first integrated circuit package may not be in direct contact with the second integrated circuit package when mounted on the substrate.

In some embodiments, the first integrated circuit package and the second integrated circuit package are integrally formed. Thus, the first integrated circuit package and the second integrated circuit package may be formed as a single unit, rather than being separated. The multi-package may be referred to as a duo antenna-in-package (DUO AiP) package, or a dual antenna-in-package (Dual AiP).

Optionally, the first integrated circuit package may be connected (directly or indirectly) to the second integrated circuit package when mounted on the substrate.

In some embodiments, the first integrated circuit package may be connected to the second integrated circuit package on the substrate by a joint. The joint may be a solder joint.

The joint may be configured to provide an electrical connection or grounding between the first integrated circuit and the second integrated circuit. This may be referred to as package-to-package grounding. The joint may be referred to as the grounding connection between the packages.

Optionally, the joint comprises an upper portion and a lower portion. The upper portion may be disposed between the first antenna sub-array and the second antenna sub-array and the lower portion may be disposed adjacent to the substrate. The lower portion of the joint may be narrower than the upper portion of the join.

The upper portion of the joint may comprise an electrically conductive material. The lower portion of the joint may comprise an electrically insulating material, or an electrically non-conductive material.

An underfill material may be disposed between a base (or underside) of the multi-package module and the substrate. The underfill may fill in any gaps between the solder bumps that mount the packages to the substrate.

Optionally, the electrically conductive material has a melting point which is lower than the melting point of the solder bumps used to surface-mount the packages to the substrate. Optionally, the electrically conductive material has a melting point which is higher than the melting point of the underfill material.

Optionally, the electrically conductive material has a melting point of 220° C. or less. In some embodiments, the electrically conductive material has a melting point of between 160° C. and 220° C.

The electrically conductive material may comprise a conductive glue or solder material. For example, the electrically conductive material may be a glue comprising metallic particles such as silver particles or the electrically conductive material may be a tin-based solder material, but it is not limited to these materials. It will be appreciated that a combination of different electrically conductive materials may be used.

Optionally, the semiconductor device may comprise a first multi-package module and a second multi-package module stacked adjacent to the first multi-package module. The first and second multi-package module may be as described in any of the above embodiments or examples.

According to an aspect of the present disclosure, there is provided a method of manufacturing a semiconductor device, comprising providing a first integrated circuit package comprising a first antenna sub-array having a uniform pitch, providing a second integrated circuit package comprising a second antenna sub-array having a uniform pitch, positioning the second integrated circuit package adjacent to the first integrated circuit package on a substrate to form a multi-package module having an antenna array formed of the first antenna sub-array and the second antenna sub-array, wherein the antenna array has a uniform pitch that is the same as the pitch of the first and second sub-arrays, and mounting the first integrated circuit package and the second integrated circuit package on the substrate.

The first and second integrated circuit packages may be as defined in any of the above embodiments or examples of the disclosure.

Optionally, positioning the second integrated circuit package adjacent to the first integrated circuit package may comprise minimising a gap between the second integrated circuit package and the first integrated circuit package. In other words, the second integrated circuit package may be positioned as close as possible to the first integrated circuit package on the substrate to reduce signal losses.

Mounting the first integrated circuit package and the second integrated circuit package may comprise surface-mounting (SMT mounting) the first integrated circuit package and the second integrated circuit package on the substrate with a plurality of solder bumps. Thus, the method may include reflowing the solder bumps (sometimes just called reflowing). The substrate may be a printed circuit board (PCB).

Positioning the second integrated circuit package may include rotating the second integrated circuit package relative to the first integrated circuit package (or vice versa). However, this is not essential, as some packages may not require rotation. Optionally, the method may include rotating the second package 90°, or 180°, or 270° relative to the first package.

The first integrated circuit package may comprise a first end and a second end. The second integrated circuit package may also comprise a first end and a second end. Positioning the second integrated circuit package adjacent to the first integrated circuit package may comprise positioning the second end of the second integrated circuit package proximate and adjacent to the second end of the first integrated circuit package. Alternatively, positioning the second integrated circuit package adjacent to the first integrated circuit package may comprise positioning the first end of the second integrated circuit package proximate and adjacent to the second end of the first integrated circuit package The first antenna sub-array may comprise a first N×M sub-array. The second antenna sub-array may comprise a second N×M sub-array. The first and second packages may be positioned such that the antenna array of the multi-package module comprises an N×2M antenna array, or a 2N×M array.

Optionally, the method may include cutting the first integrated circuit package and/or the integrated circuit package to ensure that the antenna array has a uniform pitch when the second integrated circuit package is positioned adjacent to the first integrated circuit package.

The cutting step may remove a portion of the first integrated circuit package and/or the second integrated circuit package.

The cutting step may comprise cutting off a first end portion of the first integrated circuit package and cutting off a second end portion of the second integrated circuit package.

In some embodiments, the method may comprise cutting (or sawing) off a portion of the first or second end of both the first integrated circuit package and the second integrated circuit package, then placing the cut surface of the second integrated circuit package proximate and adjacent to the cut surface of the first integrated circuit package.

The cut surface of the first and/or second integrated circuit package may have a conductive edge. Optionally, the conductive edge may be contacted to provide an electrical connection (grounding) between two or more packages. This electrical connection may be achieved by a plating, flux or adding a conductive material.

The first antenna sub-array and the second antenna sub-array may each comprise a grid of antenna elements separated by shielding walls. Optionally, the cutting step comprises cutting through the first integrated circuit package and/or the second integrated circuit package lengthwise along one of the shielding walls.

In some embodiments, the cutting step may comprise cutting (or sawing) down the middle of the final shielding wall (e.g. the $(M+1)^{th}$ shielding wall column in an N×M sub-array) on both the first and second integrated circuit packages. The cut surface of the second integrated circuit package may then be placed proximate and adjacent to the cut surface of the first integrated circuit package before mounting the packages on the substrate.

Optionally, the method may include providing grounding or an electrical connection between the first integrated circuit package and the second integrated circuit package. This may be referred to as providing package-to-package grounding.

There may be a gap between the first integrated circuit and the second integrated circuit package when mounted on the substrate. Providing package-to-package grounding may comprise: inserting an electrically insulating material into a lower portion of the gap disposed adjacent to the substrate; and inserting an electrically conductive material into an upper portion of the gap between the first antenna sub-array and the second antenna sub-array.

The method may include melting or curing the electrically insulating material. The method may include melting the electrically conductive material such that it flows into the gap between the packages, for example during a reflow process.

Optionally, the electrically conductive material may have a melting point that is lower than the melting point of the solder bumps used to mount the first and second packages to the substrate. This may prevent the solder bumps from melting (or reflowing) during reflow of the electrically conductive material.

Optionally, the melting or curing of the electrically conductive material may be at a temperature of 220° C. or less. Optionally, the melting or curing of the electrically conductive material may be at a temperature of between 160° C. and 220° C.

Optionally, the electrically conductive material may be plated or dispensed over and/or into the upper portion of the gap. This may be done after the first and second packages have been mounted to the substrate. The electrically conductive material may be a solder material, or a conductive glue, such as a glue comprising metallic particles, but is not limited to these materials.

Optionally, the method may include removing excess electrically insulating material from the upper portion of the gap before dispensing or before melting the electrically conductive material.

Optionally, providing grounding between the packages comprises the initial step of expanding the upper portion of the gap by partially cutting the first package and the second package. This may be done before mounting the first and second integrated circuit packages on the substrate. This may involve creating a step cut at an edge of each package, wherein the step-cut edge of the packages are positioned adjacent to each other in the multi-package module.

The method may include underfilling, or dispensing and curing an underfill material between a base of the multi-package module and the substrate. The curing may be at a temperature of 150° C. or less. Optionally, the underfill material is an organic resin.

According to another aspect of the present disclosure, there is provided a method of providing grounding between a first integrated circuit package and a second integrated circuit package. The method includes expanding an upper portion of a gap between the first integrated circuit package and the second integrated circuit package, dispensing an electrically non-conductive material into a lower portion of the gap, dispensing an electrically conductive material onto or into an upper portion of the gap and melting or curing the electrically conductive material such that it creates an electrical connection between the first integrated circuit package and the second integrated circuit package.

Expanding the upper portion of the gap may comprise partially cutting or sawing the first and/or second package to create a wider gap between the packages at the upper portion. This may be done before the packages are mounted to the substrate (e.g. before solder reflow) or after the packages have been mounted to the substrate.

The method may include underfilling, or dispensing and curing an underfill material between a base of the first and second packages and the substrate. Curing the underfill material may be carried out at a temperature of 150° C. or less.

The method may include curing the electrically insulating material.

Optionally, the electrically conductive material may be plated over and/or into the upper portion of the gap. This may be done after the electrically insulating material has been dispensed into the lower portion of the gap. Alternatively, the electrically conductive material may be applied over the top of the gap between the packages before the upper portion of the gap is expanded. Additional electrically conductive material may be dispensed into the upper portion of the gap after the non-conductive material has been dispensed (and optionally cured).

The electrically conductive material may be a solder material, or a conductive glue, but is not limited to these materials. The electrically conductive material may have a maximum of four times the bulk resistivity of copper (e.g. 0.00001 ohm-cm).

The method may include melting the electrically conductive material during a reflow soldering process.

Optionally, the electrically conductive material may have a melting point that is lower than the melting point of the solder bumps used to mount the first and second packages to the substrate. This may prevent the solder bumps from melting (or reflowing) during reflow of the electrically conductive material. As such, the melting or reflow of the electrically conductive material may be at a temperature of 220° C. or less, or between 160° C. and 220° C.

Optionally, the method may include removing excess electrically insulating material from the upper portion of the gap before dispensing or before melting the electrically conductive material.

The method of providing package-to-package grounding may be as described in any of the above embodiments or examples of the disclosure.

The method of providing package-to-package grounding may include cutting off a first end portion of the first integrated circuit package and/or cutting off a second end portion of the second integrated circuit package, as described in any of the above embodiments of the disclosure.

BRIEF DESCRIPTION OF THE DRAWINGS

Illustrative embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings. It will be appreciated that the drawings are schematic illustrations and are not drawn to scale.

Figure 1:
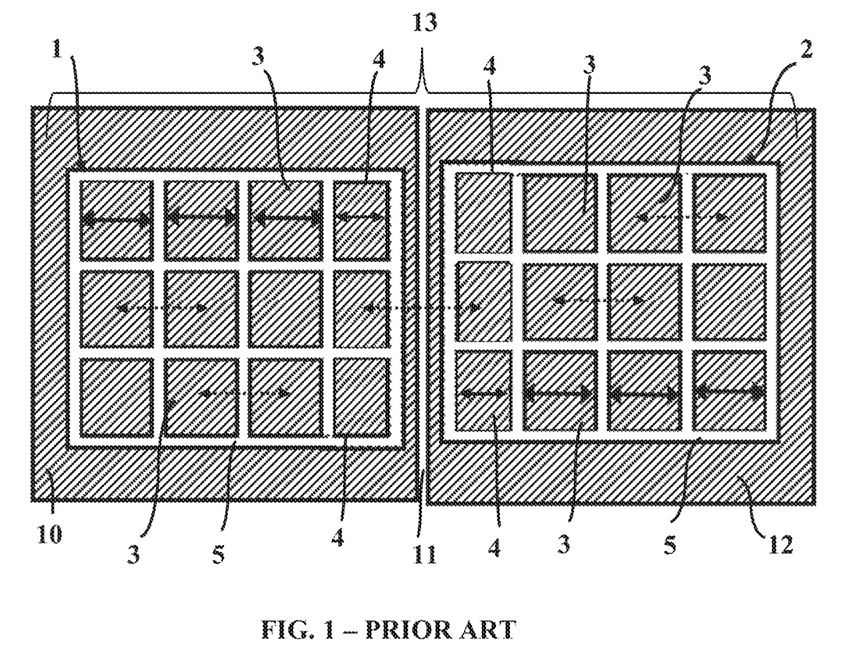
FIG. 1—shows a top view of a prior art multi-package module.
Figure 2:
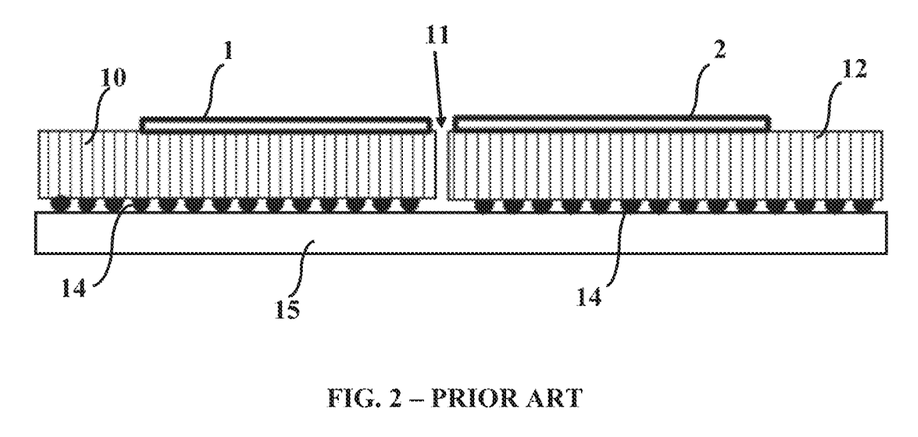
FIG. 2—shows a side view of the prior art multi-package module in FIG. 1.

FIGS. 1 and 2 show a prior art multi-package module formed of a first integrated circuit package 10 and a second integrated circuit package 12. For yield reasons, the first and second packages 10, 12 are cut into separate packages during the manufacturing process. The packages 10, 12 are surface mounted (SMT mounted) by a plurality of solder bumps 14 to a substrate, typically a printed circuit board 15, as shown in FIG. 2. There is a gap 11 between the packages when mounted. The spacing 11 between the packages 10, 12 is typically larger than 100 µm package to package. A gap 11 of around 250 µm between packages is currently industry standard. The performance of the multi-package module depends on the accuracy of the solder alignment. There is no grounding between the packages 10, 12. Each package 10, 12 is separately grounded via the PCB 15.

The first integrated circuit package 10 comprises a first antenna sub-array 1 and the second integrated circuit package 12 comprises a second antenna sub-array 2, shown in FIG. 1. Thus, the first and second packages 10, 12 are antenna-in-package (AiP) packages. The sub-arrays 1, 2 are positioned adjacent to each other to form an overall antenna array 13.

The first and second antenna sub-arrays 1, 2 are disposed on separate packages 10, 12. The gap between the two sub-arrays is wider than the gap 11 between the packages. Each sub-array 1, 2 comprises a grid of antenna elements 3, 4 separated by shielding walls 5. Each antenna element 3, 4 (or square of the grid) comprises a patch antenna (not shown). For simplicity, in FIG. 1 the first and second antenna sub-arrays 1, 2 are shown as 3×4 arrays. However, in practice the sub-arrays can be any size.

As shown in FIG. 1, the sub-arrays 1, 2 are asymmetrical, as the antenna elements do not have a uniform size and shape across the sub-arrays 1, 2. Instead, the column of antenna elements 4 adjacent to the gap 11 between the first and second packages 10, 12 are narrower than the other antenna elements 3 in the sub-arrays, as depicted by the solid arrows in FIG. 1. Thus, the pitch is not the same across each individual sub-array 1, 2. The pitch of an antenna array is the distance from the centre of an antenna element (e.g. the centre of the patch antenna) to the centre of the adjacent antenna element. If the pitch is not uniform across an antenna array or sub-array this leads to discontinuity and reduced antenna array performance. In FIG. 1 (which is not drawn to scale) the pitch is shown by the dotted arrows. Thus, the antenna elements 4 are made narrower to account for the gap 11 between the sub-arrays 1, 2, so that the pitch from package-to-package over the gap 11 can be the same as the pitch between the antenna elements 3 within the packages. However, the irregularity in the antenna size can result in increased RF noise. To achieve optimum performance of the antenna array 13, both array and sub-array irregularity (e.g. asymmetry) and discontinuity between sub-arrays should be minimised.

Figure 3:
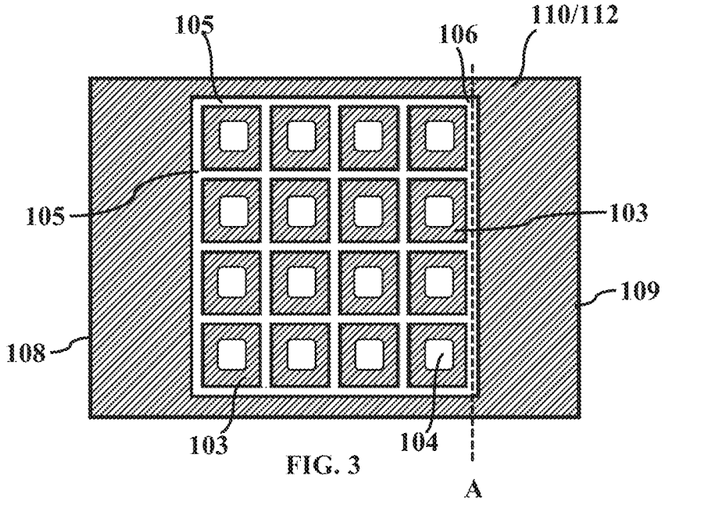
FIG. 3—shows a top view of an antenna sub-array for use in a semiconductor device according to an embodiment of the present disclosure.

An antenna sub-array according to an embodiment of the present disclosure is shown in FIG. 3. The sub-array is part of a package 110 or 112 and comprises an N×M grid of antenna elements 103 separated by shielding walls 105. For simplicity only, a 4×4 antenna sub-array is shown, however the present disclosure is not limited to square arrays and the arrays could be of any size. Each antenna element 103 (or antenna grid square) comprises a centrally positioned patch antenna 104. Although the patch antennae 104 are not shown in any subsequent figures, they are present in each antenna sub-array 101, 102. As shown in FIG. 3, the antenna elements 103 are a uniform or equal size across the antenna sub-array. However, the antenna elements are not limited to square or rectangular shapes. The pitch is also uniform across the sub-array. The spacing between each patch antenna 104 and the shielding walls 105 is also uniform or equal across the sub-array. Thus, the sub-array is symmetrical.

A first antenna sub-array 101 as shown in FIG. 3 is mounted to (or part of) a first integrated circuit package 110, and a second antenna sub-array 102 as shown in FIG. 3 is mounted to (or part of) a second integrated circuit package 112. The packages 110, 112 each have a first end 108 and a second end 109. To prepare the packages 110, 112 for forming the multi-package module 100, a portion of the second end 109 of each package 110, 112 may be removed. This allows the packages to be positioned closer together. In other embodiments, a portion of the second end 109 of the first package 110 and a portion of the first end 108 of the second package may be removed, or vice versa. Optionally, the step of removing an end portion of the first and second packages 110, 112 may form part of the package singulation process (e.g. the separation of the first package 110 from the second package 112).

Figure 4:
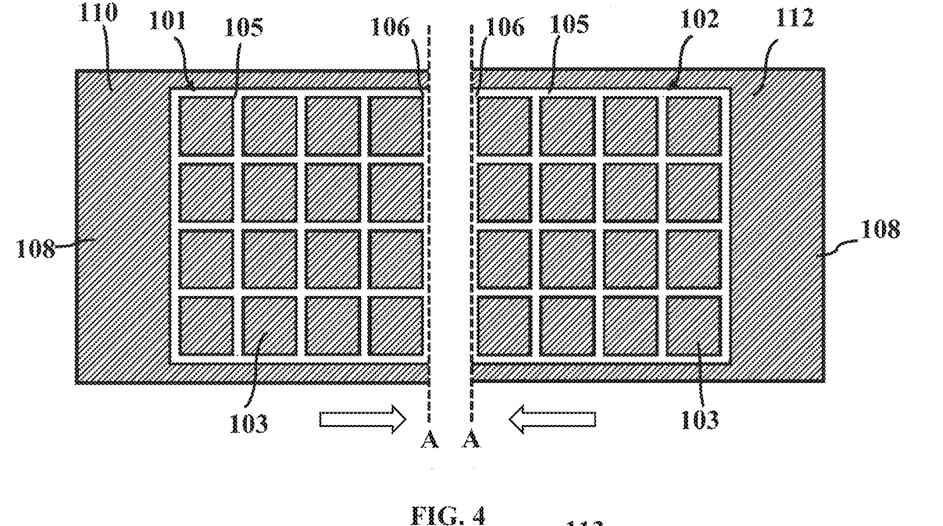
FIG. 4—shows a top view of a first integrated circuit package and a second integrated circuit package during assembly according to an embodiment of the present disclosure.

In the embodiments shown in FIGS. 3 and 4, the packages 110, 112 are cut or sawn with a blade such that (if cutting from the bottom of the page) the left-hand side of the blade runs along line A. Optionally, the thickness of the blade may be around 250 µm. As shown, line A passes through the shielding wall column 106 adjacent the second end 109, or the $(M+1)^{th}$ shielding wall column 106 of the N×M sub-array. In some embodiments the shielding wall column 106 may be cut in half lengthwise. The second package 112 is then rotated 180° relative to the first package 110, as shown in FIG. 4. It will be appreciated that in other embodiments the second package 112 may not require rotation relative to the first package 110, or the angle of rotation may be different such as 90° or 270°.

The second package 112 and the first package 110 are then moved in the directions indicated by the arrows in FIG. 4, such that the second package 112 is positioned proximate and adjacent to the first package 110. The cut surfaces of the distal ends 109 of the packages, along lines A, are placed close together. The cut surfaces (e.g. along line A) each have a conductive edge, which can be contacted if electrical connection between the two or more packages is desired (e.g. package-to-package grounding). This electrical connection can be achieved by a plating, flux or adding a conductive material.

Figure 5:
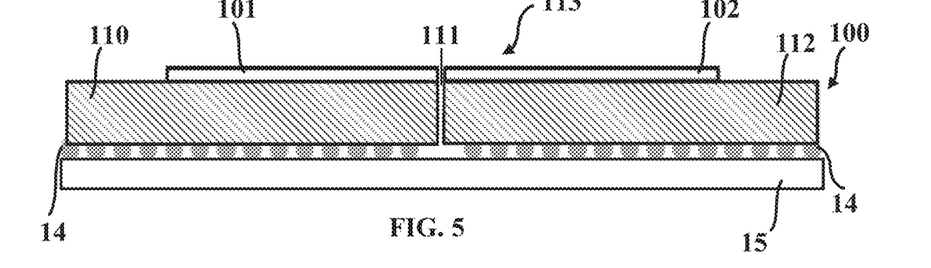
FIG. 5—shows the first integrated circuit package and the second integrated circuit package of FIG. 4 fully assembled and mounted on a substrate.

As shown in FIG. 5, the N×M antenna sub-arrays 101, 102 combine to form an overall N×2M antenna array 113, wherein the pitch is uniform across each individual sub-array 101, 102 and the pitch is also uniform across the array 113. In other embodiments, the sub-arrays 101, 102 may be positioned to form an overall 2N×M antenna array 113. The packages 110, 112 are then surface (SMT) mounted to a substrate 15 by a plurality of solder bumps 14 to form a multi-package module 100 comprising the antenna array 113. Reflow soldering may be used to complete the connection between the packages 110, 112 and the substrate 15. The substrate 15 may be a printed circuit board (PCB).

In some embodiments, there may be a gap 111 between the first and second packages 110, 112 when mounted on the substrate, as in FIG. 5. Thus, the packages may not be directly connected. This gap 111 may be minimised to reduce discontinuity and losses across the antenna array 113. The gap 111 may be the same width between the sub-arrays 101, 102 as it is between the packages 110, 112.

In some embodiments, there may not be a gap 111, so the first and second packages 110, 112 may be in direct contact when mounted on the substrate 15. The packages 110, 112 may be at least partially connected by a joint. The joint may provide grounding or an electrical connection between the packages. Methods of providing package-to-package grounding are shown in FIGS. 10 to 16.

It will be appreciated that the present disclosure is not limited to the use of just two packages. In some embodiments, the multi-package module 100 may comprise three or more packages positioned adjacent to each other or formed into an array. The packages may be referred to as tiles combining to form the multi-package module.

Figure 6:
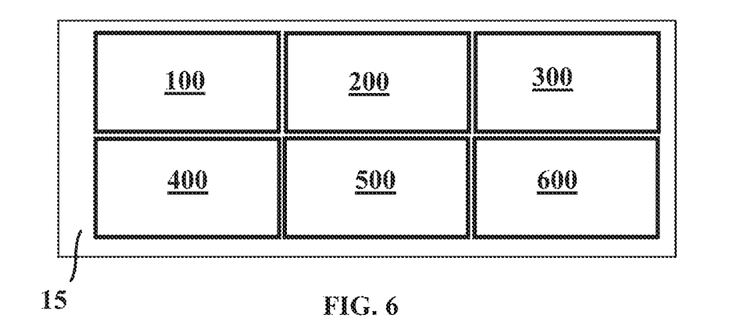
FIG. 6—shows a top view of a semiconductor device according to an embodiment of the present disclosure, comprising a plurality of multi-package modules, or a plurality of packages.
Figure 7:
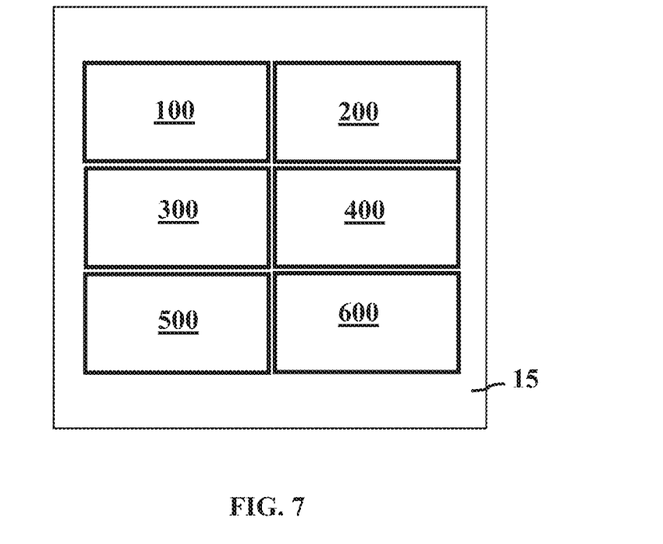
FIG. 7—shows a top view of a semiconductor device according to an embodiment of the present disclosure, comprising a plurality of multi-package modules, or a plurality of packages.

As shown in FIG. 6, a plurality of multi-package modules may be mounted on the substrate 15, each multi-package module 100, 200, 300, 400, 500, 600 comprising at least two packages 110, 112 as described above. In FIG. 6, the multi-package modules 100-600 form a 2×3 array. Another embodiment is shown in FIG. 7, in which the multi-package modules 100-600 are arranged in a 3×2 array. It will be appreciated that the multi-package modules 100-600 may be arranged in any format, not just a 2×3 array or a 3×2 array as shown. Alternatively, FIGS. 6 and 7 may illustrate a single multi-package module mounted on the substrate 15, wherein features 100-600 correspond to the integrated circuit packages forming the multi-package module.

Figure 8:
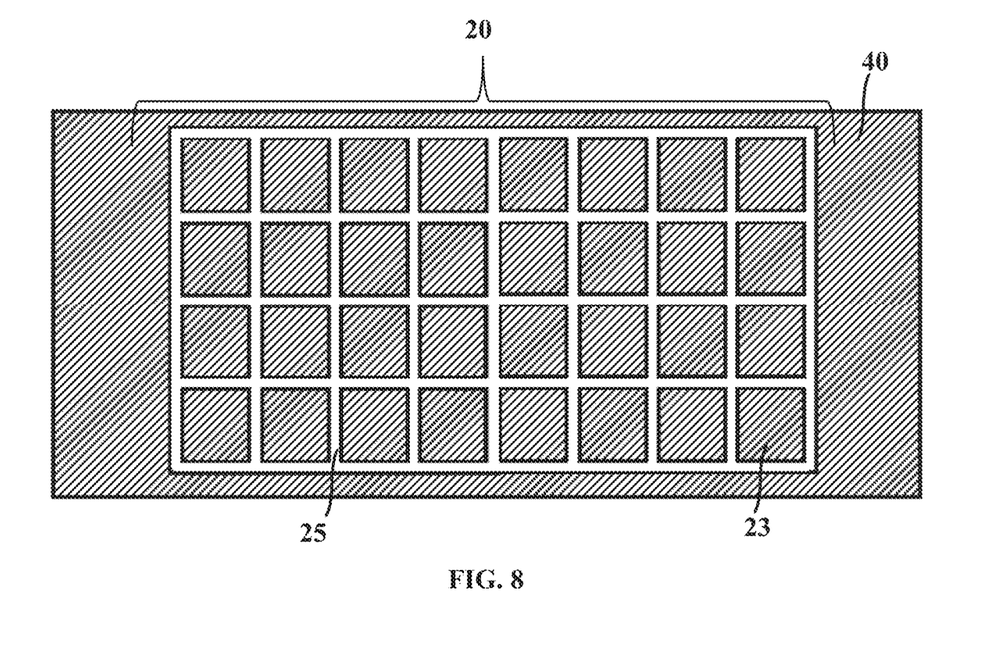
FIG. 8—shows a top view of a duo antenna-in-package (AiP) package, wherein the first integrated circuit package and the integrated circuit package are integrally formed.
Figure 9:
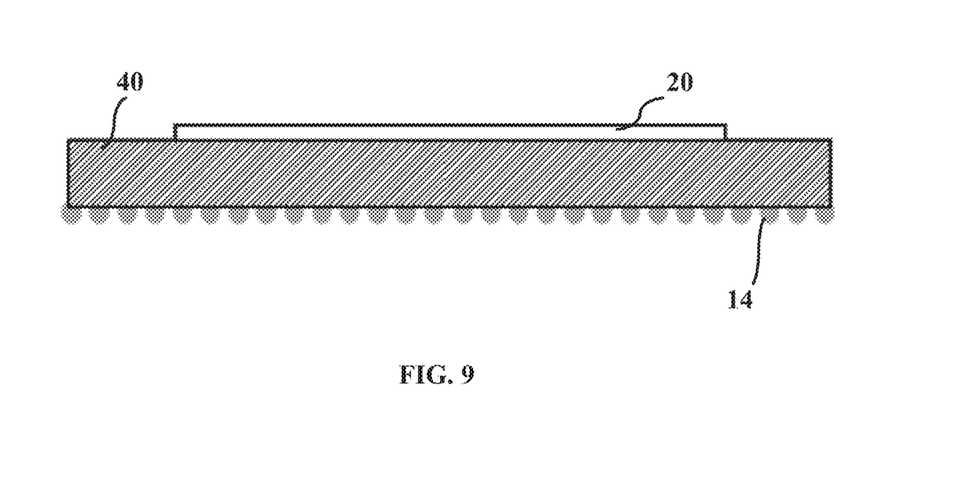
FIG. 9—shows a side view of the package in FIG. 8.

In some embodiments, as shown in FIGS. 8 and 9, the first and second packages may be integrally formed (i.e. not separated during the manufacturing process). Thus, the multi-package module may be formed as a single integral unit 40, comprising a continuous N×2M antenna array 20 (or 2N×M array). The antenna array 20 comprises a grid of antenna elements 23 separated by shielding walls 25, wherein each antenna element 23 is the same size and shape and the pitch is uniform across the array 20. By keeping the two packages intact any RF noise between the two sub-arrays should be minimised or eliminated.

Figure 10:
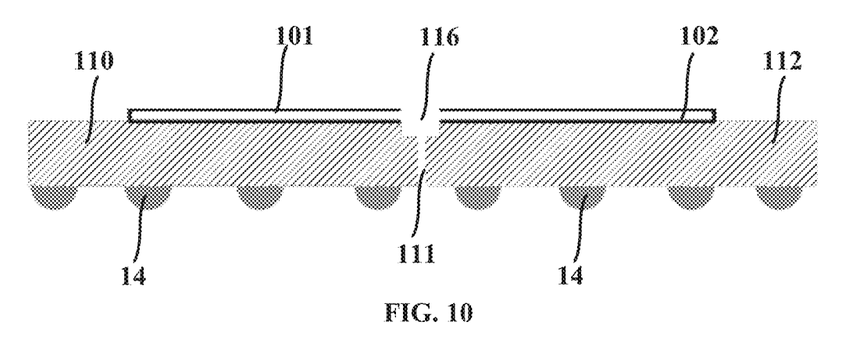
FIG. 10—shows a side view of a first integrated circuit package and a second integrated circuit package following an initial stage of providing package-to-package grounding.
Figure 11:
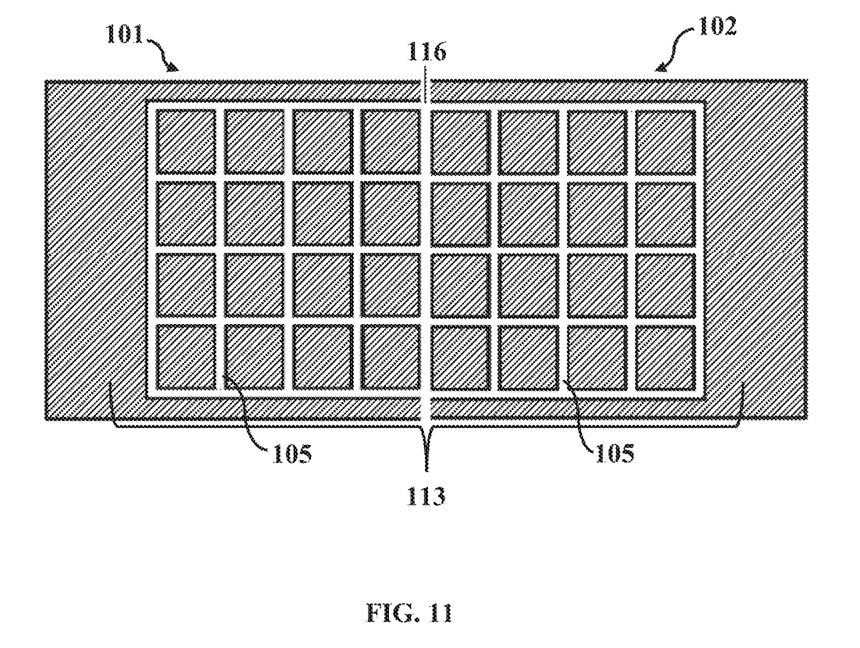
FIG. 11—is a top view of the device in FIG. 10.

FIG. 10 shows a step in a process of providing package-to-package grounding according to an embodiment of the disclosure. Providing grounding (or an electrical connection) between the packages 110, 112, rather than relying on grounding each package via the substrate 15, may reduce losses and improve RF performance of the multi-package module.

Before the packages 110, 112 are mounted to the substrate 15 (e.g. at the stage shown in FIG. 4 before solder reflow) the first antenna sub-array 101 and the second antenna sub-array 102 may be partially cut to expand the gap 111 between the packages. This may form an upper portion 116 of the gap which is wider than the lower portion 111 of the gap. This may be done by partially sawing or otherwise cutting each of the packages 110, 112 (e.g. creating a step cut), also referred to as creating a trench between the packages. In some embodiments, the upper portion of the gap may be around 100 µm or less and the bottom portion of the gap may be around 50 µm or less. The thickness of the blade used to cut the packages 110, 112 and the dimensions of the antenna sub-array 101, 102 must be taken into account when making the cut. For example, (referring to FIG. 4) if cutting from the bottom of the page, the left-hand side of the blade may be aligned between line A and the edge of the shielding wall 106 to make the partial cut.

The lower portion 111 of the gap may remain unchanged. It should be noted that the gap 116 is not shown to scale in FIG. 10. The expansion of the gap 116 does not destroy the symmetry and regularity of the antenna array 113. For example, the gap 116 may remove a further portion the shield walls 106 adjacent to the gap 111, as shown in the top view of FIG. 11. The shield walls 106 are not completely removed even though they are not visible in FIG. 11. Typically, the shield walls 106 adjacent to the gap 11 are cut to become less than half of the original wall thickness.

Figure 12:
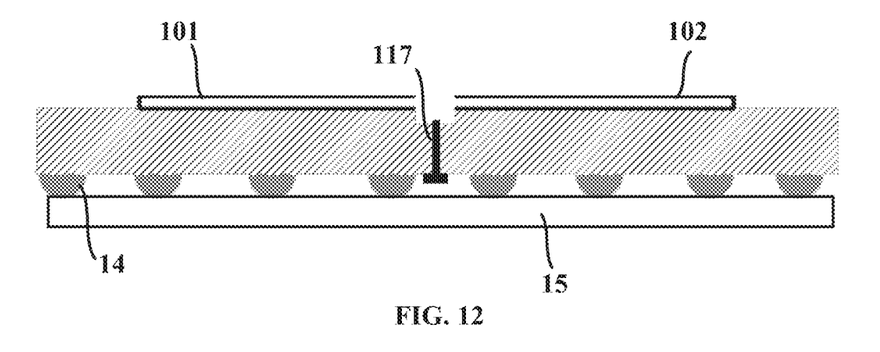
FIG. 12—shows a subsequent stage in the grounding process after FIG. 10.

The packages 110, 112 may then be mounted to the substrate 15, as described above. The next step in the grounding process may be to dispense and cure an electrically non-conductive material 117 into the lower (narrow) portion 111 of the gap, as shown in FIG. 12. The electrically non-conductive (or electrically insulating) material 117 may avoid any shorts between the solder bumps 14 and the electrically conductive material that will be inserted into the upper portion of the gap. If excess electrically non-conductive material 117 extends into the upper portion 116 of the gap, this may optionally be removed, for example by cutting or sawing.

Figure 13:
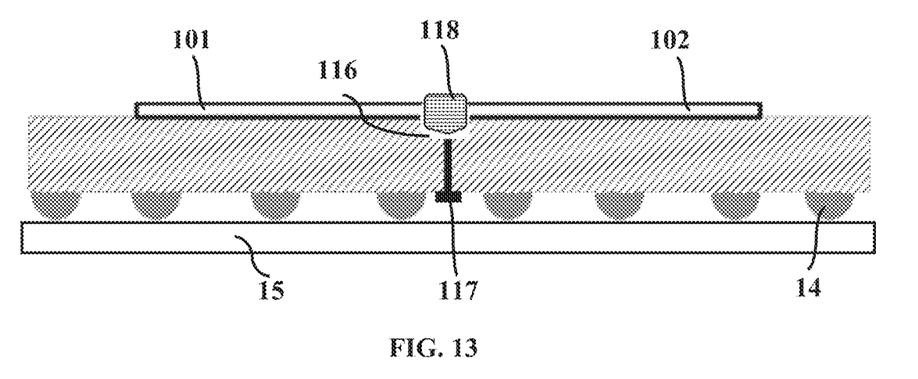
FIG. 13—shows a subsequent stage in the grounding process after FIG. 12.
Figure 14:
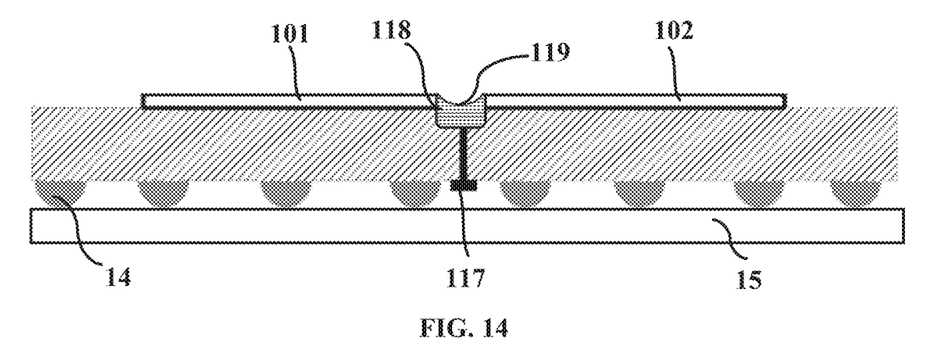
FIG. 14—shows a subsequent stage in the grounding process after FIG. 13.

An electrically conductive material 118 may then be dispensed or plated over the upper portion of the gap 116, as shown in FIG. 13. The electrically conductive material 118 may then be melted or cured. The electrically conductive material 118 flows into the upper portion 116 of the gap to form an electrical connection between the packages 110, 112, as shown in FIG. 14. The electrically conductive material 118 may form a meniscus 119, preferably below the top surface of the packages 110, 112.

The electrically conductive material 118 may have a melting point which is lower than the melting point of the solder bumps 14. For example, the electrically conductive material 118 may be a solder material having a melting point of less than 220° C. This may prevent the solder bumps 14 from re-melting during reflow of the electrically conductive material 118, as a lower temperature can be used than for reflowing the solder bumps 14.

Figure 15:
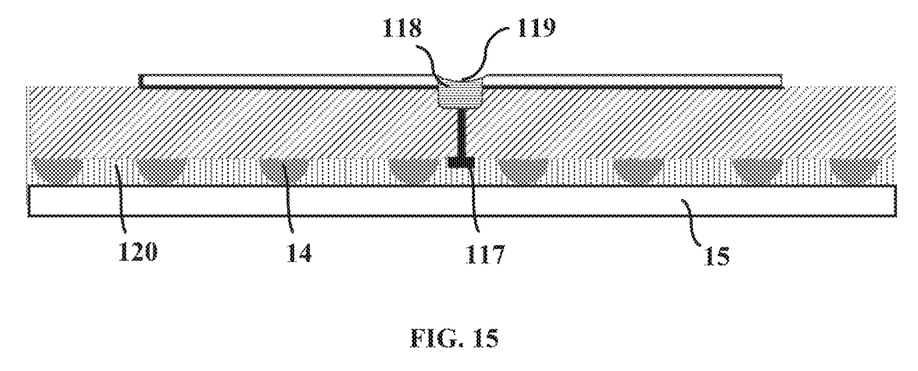
FIG. 15—shows the device in FIG. 14 after underfilling.

Finally, an underfill material 120 may be dispensed between an underside of the multi-package module and the substrate 15, as shown in FIG. 15. The underfill material 120 may fill the spaces between the solder bumps 14. The underfill material 120 may be cured at a temperature of less than 150° C. The underfill material 120 is typically used to improve the board level reliability of the device, as it helps to protect the solder bumps 14 from thermal stresses and reduce package warpage. Optionally, the non-conductive material 117 may be underfill material 120, as capillary action may be used to force the underfill into the lower portion 111 of the gap.

Figure 16:
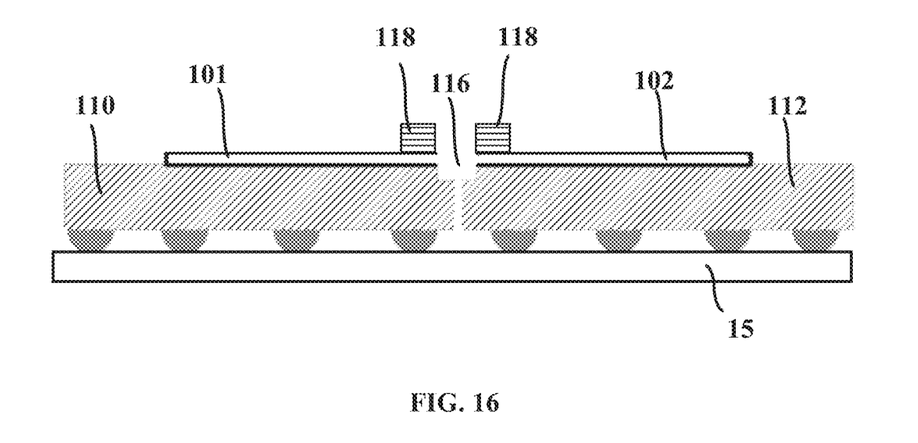
FIG. 16—shows an alternative stage in the grounding process to FIG. 10.

Alternatively, the packages 110, 112 may be surface-mounted to the substrate 15 before beginning the process of providing package-to-package grounding. In some embodiments, the electrically conductive material 118 may then be deposited over the gap 111. The trench may then be created to expand the upper portion of the gap 116 (as described above in relation to FIGS. 10 and 11) which removes the central portion of the electrically conductive material, as shown in FIG. 16. Thus, electrically conductive material 118 can be applied on a panel level after partial cutting of the topside of the package 110, 112 or after board mount on a PCB 15. The grounding process may continue as shown in FIG. 12, with the dispensing and curing of the electrically insulating material 117 to close the bottom portion 111 of the gap.

The two remaining portions of the electrically conductive material 118 may then be melted to reflow the electrically conductive material 118 into the upper portion of the gap 116, as shown in FIG. 14. In some embodiments, additional electrically conductive material 118 may be dispensed into the gap 116. Underfill material 120 may then be added, as in FIG. 15.

Accordingly, there has been described a semiconductor device comprising: a substrate (such as a printed circuit board), a first integrated circuit package mounted on the substrate, the first integrated circuit package comprising a first antenna sub-array, a second integrated circuit package mounted on the substrate, the second integrated circuit package comprising a second antenna sub-array, wherein the second integrated circuit package is mounted adjacent to the first integrated circuit package to form a multi-package module having an antenna array formed of the first antenna sub-array and the second antenna sub-array, and wherein the antenna array has a uniform pitch which is the same as the pitch of the first and second sub-arrays.

Also described is a method of manufacturing a multi-package module which has a uniform pitch across the antenna sub-arrays and the antenna array. The method may include a providing grounding between a first integrated circuit package and a second integrated circuit package. The method may include expanding an upper portion of a gap between the first integrated circuit package and the second integrated circuit package, dispensing an electrically non-conductive material into a lower portion of the gap, dispensing an electrically conductive material onto or into an upper portion of the gap and melting the electrically conductive material such that it joins the first integrated circuit package to the second integrated circuit package.

The term 'antenna' or 'antenna element' refers to the square of an antenna grid surrounded by shielding walls. Equivalently, the term 'antenna' used above means the patch antenna and the space between the patch antenna and the surrounding shielding walls of the antenna array.

Although particular embodiments of this disclosure have been described, it will be appreciated that many modifications/additions and/or substitutions may be made within the scope of the claims.

The invention claimed is:

1. A semiconductor device comprising:
a substrate;
a first integrated circuit package mounted on the substrate, the first integrated circuit package comprising a first antenna sub-array, wherein the first antenna sub-array has a uniform pitch;
a second integrated circuit package mounted on the substrate, the second integrated circuit package comprising a second antenna sub-array, wherein the second antenna sub-array has a uniform pitch;
wherein the second integrated circuit package is mounted adjacent to the first integrated circuit package to form a multi-package module having an antenna array formed of the first antenna sub-array and the second antenna sub-array, wherein the antenna array has a uniform pitch that is the same as the pitch of the first antenna sub-array and the second antenna sub-array,
wherein the first integrated circuit package is connected to the second integrated circuit package on the substrate by a joint,
wherein the joint is configured to provide grounding or an electrical connection between the first integrated circuit package and the second integrated circuit package,
wherein the joint comprises an upper portion and a lower portion,
wherein the upper portion is disposed between the first antenna sub-array and the second antenna sub-array and comprises an electrically conductive material, and
wherein the lower portion is disposed adjacent to the substrate and comprises an electrically insulating material.

2. The semiconductor device of claim 1, wherein the antenna array comprises a plurality of antenna elements and each of the plurality of antenna elements are the same size and shape.

3. The semiconductor device of claim 1, wherein there is a gap between the first integrated circuit package and the second integrated circuit package when mounted on the substrate.

4. The semiconductor device of claim 1, wherein the first integrated circuit package and the second integrated circuit package are integrally formed.

5. The semiconductor device of claim 1, wherein the multi-package module is formed of at least three integrated circuit packages positioned adjacent to each other, each integrated circuit package comprising a sub-array that has a uniform pitch.

6. The semiconductor device of claim 2, wherein there is a gap between the first integrated circuit package and the second integrated circuit package when mounted on the substrate.

7. The semiconductor device of claim 1, further comprising a plurality of multi-package modules, wherein the multi-package modules are mounted adjacent to each other on the substrate.

8. A method of manufacturing a semiconductor device, comprising:
   providing a first integrated circuit package comprising a first antenna sub-array, wherein the first antenna sub-array has a uniform pitch;
   providing a second integrated circuit package comprising a second antenna sub-array, wherein the second antenna sub-array has a uniform pitch;
   positioning the second integrated circuit package adjacent to the first integrated circuit package on a substrate to form a multi-package module having an antenna array formed of the first antenna sub-array and the second antenna sub-array, wherein the antenna array has a uniform pitch that is the same as the pitch of the first antenna sub-array and the second antenna sub-array;
   mounting the first integrated circuit package and the second integrated circuit package on the substrate, wherein there is a gap between the first integrated circuit and the second integrated circuit package when mounted on the substrate; and
   providing grounding or an electrical connection between the first integrated circuit package and the second integrated circuit package by:
      inserting an electrically insulating material into a lower portion of the gap disposed adjacent to the substrate; and
      inserting an electrically conductive material into an upper portion of the gap between the first antenna sub-array and the second antenna sub-array.

9. The method of claim 8, wherein positioning the second integrated circuit package adjacent to the first integrated circuit package comprises:
   minimising the gap between the first integrated circuit package and the second integrated circuit package; and/or
   rotating the second integrated circuit package relative to the first integrated circuit package.

10. The method of claim 8, further comprising cutting the first integrated circuit package and/or the second integrated circuit package to ensure that the antenna array of the multi-package module has a uniform pitch.

11. The method of claim 10, wherein the cutting step comprises cutting off an end portion of the first integrated circuit package and cutting off an end portion of the second integrated circuit package; and/or
   wherein the first antenna sub-array and the second antenna sub-array each comprise a grid of antenna elements separated by shielding walls, and the cutting step comprises cutting through the first integrated circuit package and the second integrated circuit package lengthwise along one of the shielding walls.

12. The method of claim 8, wherein providing grounding between the first integrated circuit package and the second integrated circuit package comprises expanding the upper portion of the gap by making a partial or step cut in the first and second integrated circuit packages.

13. The method of claim 8, further comprising:
   positioning at least a third integrated circuit package adjacent to the first integrated circuit package or the second integrated circuit package on the substrate, such that the multi-package module is formed of at least three integrated circuit packages; and/or
   forming a plurality of multi-packages modules as defined in any preceding claim and mounting the multi-packages modules adjacent to each other on the substrate.

14. The method of claim 9, further comprising cutting the first integrated circuit package and/or the second integrated circuit package to ensure that the antenna array of the multi-package module has a uniform pitch.

* * * * *